United States Patent [19]
Krueger et al.

[11] Patent Number: 5,982,818
[45] Date of Patent: Nov. 9, 1999

[54] METHOD FOR IMPLEMENTING TRELLIS CODES FOR ISI CHANNELS

[75] Inventors: Daniel J. Krueger, 2601 Clear Cove, Austin, Tex. 78704; Joao R. Cruz, R.R. #1, Box 117B-4, Norman, Okla. 73072

[73] Assignees: Daniel J. Krueger, Austin, Tex.; Joao R. Cruz, Norman, Okla.

[21] Appl. No.: 08/779,510

[22] Filed: Jan. 7, 1997

[51] Int. Cl.⁶ ........................................... H04L 5/12
[52] U.S. Cl. ..................... 375/265; 375/265; 375/263; 375/348
[58] Field of Search ..................... 375/265, 290, 375/262, 341, 308, 254, 286, 340, 348, 263; 371/43.4, 43.7, 43.1

[56] References Cited

U.S. PATENT DOCUMENTS

| | | | |
|---|---|---|---|
| 4,922,507 | 5/1990 | Simon et al. | 375/254 |
| 4,939,555 | 7/1990 | Calderbank et al. | 375/286 |
| 5,040,191 | 8/1991 | Forney, Jr. et al. | 375/263 |
| 5,570,391 | 10/1996 | Lin et al. | 375/265 |

OTHER PUBLICATIONS

*Combined Equalization and Coding Using Precoding*, G. David Forney, Jr. and M. Vedat Eyuboğlu, IEEE Communications Magazine, Dec. 1991, pp. 25–34.

*A Modified Trellis Coding Technique for Partial Response Channels*, Reinhold Haeb, IEEE Transactions on Communications, vol. 40, No. 3, Mar. 1992, pp. 513–520.

*Improved Coding Techniques for Precoded Partial–Response Channels*; Kjell J. Holeand Oyvind Ytrehus; IEEE Transactions on Information Theory, vol. 40, No. 2, Mar. 1994, pp. 482–493.

*Trellis Code Design for Intersymbol Interference Channels*, Daniel J. Krueger, Ph.D. Dissertation, University of Oklohoma, Norman, 1995, passim.

*Channel Coding with Multilevel/Phase Signals*, Gottfried Ungerboeck, IEEE Transactions on Information Theory, vol. IT–28, No. 1, Jan. 1982, pp. 55–67.

*Trellis Coding for Partial–Response Channels*, Jack K. Wolf, IEEE Transactions, vol. Com.–34, No. 8, Aug. 1986, pp. 765–773.

*Coset Codes for Partial Response Channels*; or, *Coset Codes with Spectral Nulls*, G. David Forney, Jr., IEEE Transactions on Information Theory, vol. 35, No. 5, Sep. 1989, pp. 925–943.

*Matched Spectral–Null Codes for Partial–Response Channels*, Raznik Karabed and Paul H. Siegel, IEEE Transactions on Information Theory, vol. 37, No. 3, May 3, 1991, pp. 818–855.

Primary Examiner—Stephen Chin
Assistant Examiner—Shuwang Liu
Attorney, Agent, or Firm—Haynes & Boone, L.L.P.

[57] ABSTRACT

A method of design and implementation of trellis codes for intersymbol interference channels is provided wherein a set of input vectors is mapped to a set of output vectors comprising the steps of forming a minimized basis having a set of minimized basis vectors configured for a set of channel output signals corresponding to the set of output vectors; selecting the smallest member of the set of minimized basis vectors as a coset vector; forming a partition basis by adding the coset vector to at least one member of the set of the minimized basis vectors; and forming a subsequent minimized basis from the partition basis. These codes circumvent the necessity for intersymbol interference removal, thereby reducing equalization complexity.

18 Claims, 5 Drawing Sheets

| INPUT | MAPPER OUTPUT | CHANNEL OUTPUT | EDGE SELECTOR OUTPUT |
|---|---|---|---|
| 00000 | 01111 | 0, +1, +2, +1, 0, −1, −2, −1 | 000 |
| 00001 | 11101 | +1, +2, +1, −1, −1, 0, −1, −1 | 000 |
| 00010 | 00000 | 0, 0, 0, 0, 0, 0, 0, 0 | 001 |
| 00011 | 11110 | 0, +1, +2, +1, 0, −1, −2, −1 | 001 |
| 00100 | 01100 | 0, +1, +2, 0, −2, −1, 0, 0 | 010 |
| 00101 | 10010 | +1, +1, −1, 0, +1, −1, −1, 0 | 010 |
| 00110 | 00011 | 0, 0, 0, +1, +2, 0, −2, −1 | 011 |
| 00111 | 10001 | +1, +1, −1, −1, +1, +1, −1, −1 | 011 |
| 01000 | 00110 | 0, 0, +1, +2, 0, −2, −1, 0 | 100 |
| 01001 | 10100 | +1, +1, 0, 0, −1, −1, 0, 0 | 100 |
| 01010 | 00101 | 0, 0, +1, +1, 0, 0, −1, −1 | 101 |
| 01011 | 11011 | +1, +2, 0, −1, +1, 0, −2, −1 | 101 |
| 01100 | 01001 | 0, +1, +1, −1, 0, +1, −1, −1 | 110 |
| 01101 | 10111 | +1, +1, 0, +1, +1, −1, −2, −1 | 110 |
| 01110 | 01010 | 0, +1, +1, 0, 0, −1, −1, 0 | 111 |
| 01111 | 11000 | +1, +2, 0, −2, −1, 0, 0, 0 | 111 |
| 10000 | 00010 | 0, 0, 0, +1, +1, −1, −1, 0 | 000 |
| 10001 | 10000 | +1, +1, −1, −1, 0, 0, 0, 0 | 000 |
| 10010 | 00001 | 0, 0, 0, 0, +1, +1, −1, −1 | 001 |
| 10011 | 11111 | +1, +2, +1, 0, 0, −1, −2, −1 | 001 |
| 10100 | 01110 | 0, +1, +2, +1, −1, −2, −1, 0 | 010 |
| 10101 | 11100 | +1, +2, +1, −1, −2, −1, 0, 0 | 010 |
| 10110 | 01101 | 0, +1, +2, 0, −1, 0, −1, −1 | 011 |
| 10111 | 10011 | +1, +1, −1, 0, +2, 0, −2, −1 | 011 |
| 11000 | 01000 | 0, +1, +1, −1, −1, 0, 0, 0 | 100 |
| 11001 | 10110 | +1, +1, 0, +1, 0, −2, −1, 0 | 100 |
| 11010 | 00111 | 0, 0, +1, +2, +1, −1, −2, −1 | 101 |
| 11011 | 10101 | +1, +1, 0, 0, 0, 0, −1, −1 | 101 |
| 11100 | 00100 | 0, 0, +1, +1, −1, −1, 0, 0 | 110 |
| 11101 | 11010 | +1, +2, 0, −1, 0, −1, −1, 0 | 110 |
| 11110 | 01011 | 0, +1, +1, 0, +1, 0, −2, −1 | 111 |
| 11111 | 11001 | +1, +2, 0, −2, 0, +1, −1, −1 | 111 |

*Fig. 5*

METHOD FOR IMPLEMENTING TRELLIS CODES FOR ISI CHANNELS

BACKGROUND OF THE INVENTION

The present invention relates to a method and system for encoding channels for digital communications. More specifically, this invention relates to the use of trellis codes designed for using intersymbol interference (ISI) to increase the reliability or reduce the complexity of high speed communication across bandlimited channels.

The practice of designing error control codes independently of channel considerations has a detrimental impact on the performance of systems, particularly of systems utilizing bandlimited channels. A solution to this problem known as trellis-coded modulation was described by Gottfried Ungerboeck in an article entitled "Channel Coding with Multilevel/Phase Signals," *IEEE Transactions on Information Theory,* Vol. IT-28, No. 1, pp. 55–67, January 1982. Ungerboeck incorporated a modulation scheme into the encoder, and relied on a heuristic partitioning technique. Channels with intersymbol interference (ISI), however, had to be equalized to remove the interference.

Attempts have been made to extend trellis-coded modulation to specific ISI channels. For example, in 1986, Wolf and Ungerboeck designed trellis codes for the binary partial response channel by partitioning the channel output by hand (J. K. Wolf and G. Ungerboeck, "Trellis Coding for Partial-Response Channels," *IEEE Transactions on Communications,* Vol. COM-34, No. 8, pp. 765–773, August 1986). They also showed that the same performance could be obtained using a convolutional code followed by a precoder for the channel. This latter approach gained support in 1989 when Forney and Calderbank argued that as the cardinality of the channel alphabet increases, the performance of the precoded partial response channel approaches that of the MLSE equalized channel (G. D. Forney, Jr. and M. V. Eyuboglu, "Combined Equalization and Coding Using Precoding" *IEEE Communications Magazine,* pp. 25–34, December 1991). This would seem to indicate that for the binary partial response channel, at least, the code design could be done independently of the channel. However, in 1994, Hole and Ytrehus concluded that for the binary 1-D channel, the best convolutional code to precede the precoder is not necessarily a maximum Hamming distance code. By designing the code to maximize the Euclidean distance at the output of the channel, it is often possible to improve the system performance (K. J. Hole and O. Ytrehus, "Improved Coding Techniques for Precoded Partial-Response Channels," *IEEE Transactions on Information Theory,* Vol. 40, No. 2, pp. 482–493, March 1994).

Another approach to code design for partial response channels has been disclosed by Forney, Calderbank, Karabed, Siegel wherein the codes utilized are matched spectral null codes (G. D. Forney, Jr., and A. R. Calderbank, in "Coset Codes for Partial Response Channels; Or, Coset Code in Spectral Nulls," *IEEE Transactions on Information Theory,* Vol. 35, No. 5, pp. 925–943, September 1989; R. Karabed and P. H. Siegel, "Matched Spectral-Null Codes for Partial-Response Channels," *IEEE Transactions on Information Theory,* Vol. 37, No. 3, pp. 818–855, May 1991). However in 1992, Haeb explored trellis code design by partitioning of the output of the q-ary partial response channel by exhaustive search, and concluded that this provided a generalization of the early matched spectral null work with consequent high gains and moderate decoding complexity (R. Haeb, "A Modified Trellis Coding Technique for Partial Response Channels," *IEEE Transactions on Communications,* Vol. 40, No. 3, pp. 513–520, March 1992).

While trellis coded modulation is recognized as a powerful coding technique, what is needed is a practical method and system for applying trellis coded modulation to general ISI channels.

SUMMARY OF THE INVENTION

The present invention, accordingly, provides a method for designing and implementing trellis codes for intersymbol interference channels. To this end, the method of the present invention comprises mapping a set of input vectors to a set of output vectors by forming a minimized basis having a set of minimized basis vectors configured for a set of channel output signals corresponding to the set of output vectors; selecting the smallest member of the set of minimized basis vectors as a coset vector; forming a partition basis by adding the coset vector to at least one member of the set of the minimized basis vectors; and forming a subsequent minimized basis from the partition basis.

An advantage achieved with the present invention is that the codes circumvent the necessity for intersymbol interference removal, thereby reducing equalization complexity.

Another advantage achieved with the present invention is that it provides for a reduced error rate in data communications.

Another advantage achieved with the present invention is that, for a given error rate, the complexity and cost of an encoding system may be reduced.

BRIEF DESCRIPTION OF THE DRAWINGS

FIG. 5 is a tabulation of the mapper function and the edge selector function of the trellis encoder of FIG. 2.

DETAILED DESCRIPTION OF THE PREFERRED EMBODIMENT

Figure 1:
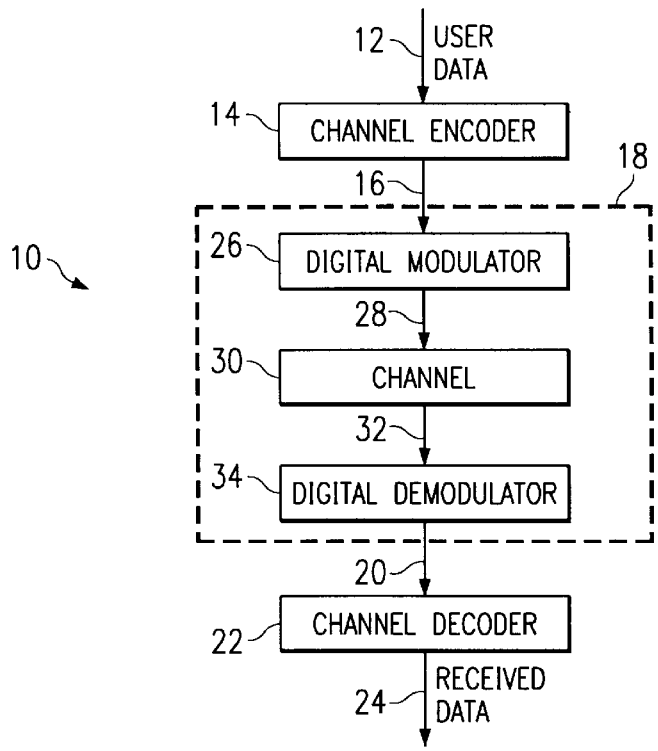
FIG. 1 is a functional schematic diagram of the trellis encoded digital communications channel embodying features of the present invention.

Referring to FIG. 1, the reference numeral 10 refers, in general, to a trellis encoded digital communications system embodying features of the present invention for transmitting data from a user (or other signal generator, not shown) to a receiver (not shown). The system 10 includes a line 12 for receiving data input from the user, and transferring the input data to a channel encoder 14. As described in greater detail below, the channel encoder 14 receives the input data on the line 12, encodes the input data, and outputs the encoded data onto a line 16 to an equivalent discrete channel 18. The equivalent discrete channel 18 receives the encoded data, carries it on a channel in a manner described below, and outputs it onto a line 20 to a channel decoder 22. The channel decoder 22 decodes the data in a conventional manner (e.g., using a Viterbi algorithm) and outputs the decoded data onto a line 24 to the receiver.

The equivalent discrete channel 18 is preferably configured in accordance with an Extended Partial Response, Class 4, (EPR4) transfer function, well known in the art, although any of a number of different transfer functions may be utilized. It is noted that the present invention may be applied to all channels having finite impulse responses, including those channels having transfer function with non-integer coefficients. The channel 18 comprises a digital modulator 26 electrically connected for receiving the encoded data on the line 16, and for modulating the encoded data. The modulator 26 outputs the modulated data onto a line 28 to a channel medium 30, such as a satellite telecommunications link or a magnetic storage disk. The channel medium 30 is operative for outputting the modulated data onto a line 32 to a digital demodulator 34, configured for demodulating the modulated data and outputting onto the line 20 the demodulated data to the channel decoder 22.

Figure 2:
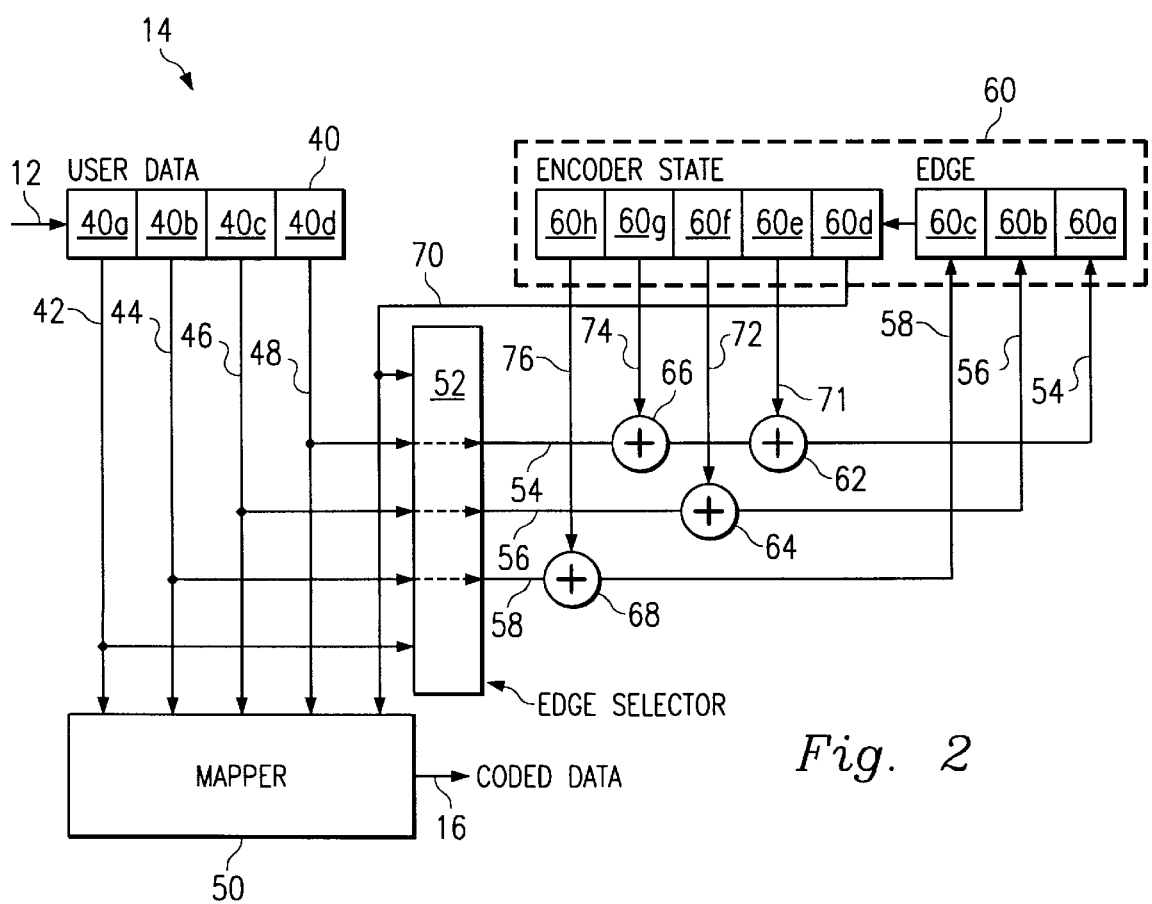
FIG. 2 is a schematic block diagram of a trellis encoder utilized in the digital communications channel of FIG. 1.

Referring to FIG. 2, the channel encoder 14 comprises a 4-bit input register 40 configured for receiving into four register cells 40a, 40b, 40c, and 40d four bits of data at a time from the user via the line 12 connected to any of a number of different input devices such as, for example, a computer and a keyboard (not shown). The four cells 40a, 40b, 40c, and 40d are electrically connected for passing the four bits of data stored therein via four lines 42, 44, 46, and 48, respectively, to a mapper 50 and an edge selector 52, described below. The mapper 50 comprises a conventional lookup table (not shown, but described below) configured for generating five output bits. The edge selector 52 is here configured to pass bits directly through without any encoding or modification, though the edge selector could also include a lookup table for encoding or modifying the data output therefrom.

The edge selector 52 is electrically connected, via three lines 54, 56, and 58, to three edge cells 60a, 60b, and 60c of a shift register 60. The shift register 60 also includes five feedback encoder state cells 60d, 60e, 60f, 60g, and 60h. At the end of each clock cycle the contents of shift register 60 is shifted three cells to the left. Four modulo-2 adders 62, 64, 66, and 68 are electrically interconnected, via four lines 71, 72, 74, and 76, respectively, between the lines 54, 56, 54, and 58, respectively, and the feedback encoder state cells 60e, 60f, 60g, and 60h, respectively, to modify the signal carried to edge cells 60a, 60b, 60a, and 60c, respectively. The feedback encoder state cell 60d is electrically connected via the line 70 for supplying a fifth, or redundancy, bit to the mapper 50 and optionally to the edge selector 52.

The five lines 42, 44, 46, 48, and 70 are connected to the mapper 50 such that the aforementioned lookup table (not shown) receives and operates on five bits of data every clock cycle. For every five bits input into the mapper 50 via the five lines 42, 44, 46, 48, and 70, the lookup table generates five bits which are serially output from the mapper onto the line 16. In the design of the lookup table, each combination of five data bits output may be considered to be a signal point.

Figure 3:
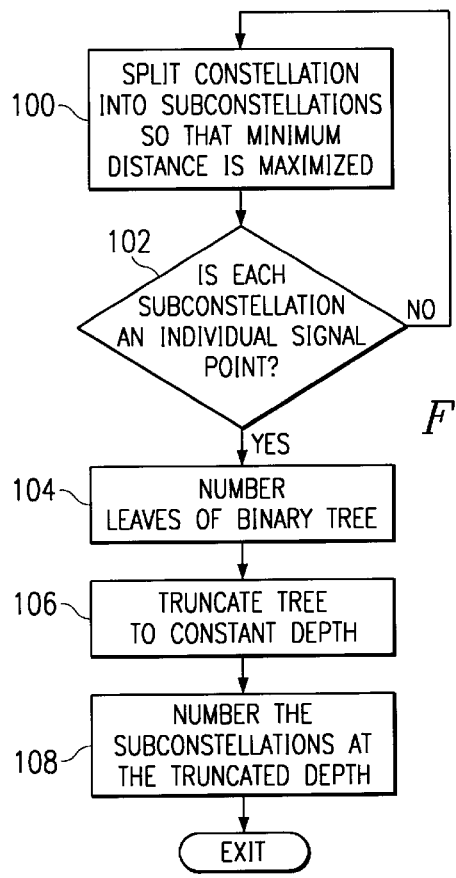
FIG. 3 is a flowchart of the method used to design the lookup table implemented in the mapper 50.
Figure 4:
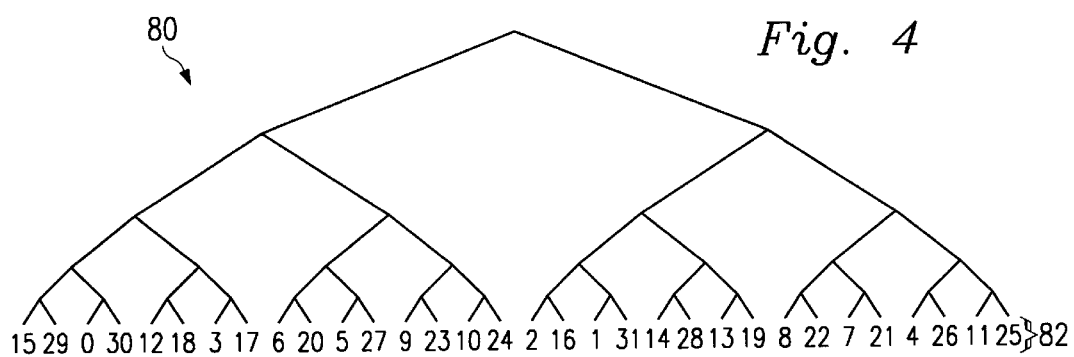
FIG. 4 is a binary tree used in the design of the trellis encoder of FIG. 2.

FIG. 3 shows a flow chart of the method used to design the lookup table in the mapper 50. In step 100, described in greater detail below, a signal constellation comprising the set of all possible signal points at the channel output, is split into two subconstellations in such a way as to maximize the minimum Euclidian distance between signal points in the subconstellations. In step 102, a determination is made whether each subconstellation is an individual signal point. If in step 102 it is determined that each subconstellation is not a signal point, then step 100 is repeated with each subconstellation. If in step 102 it is determined that each subconstellation is a signal point, then it can be appreciated that a diagram of the branches of the constellation constitute a "binary tree," 80 as shown in FIG. 4, wherein each of the individual signal points constitutes a "leaf" 82 of the "tree." In step 104, the leaves 82 of the binary tree 80 containing the individual signal points are numbered from left to right using binary numbers so that a binary number is associated with each signal point in the binary tree. It can be appreciated that, upon receiving a five bit binary number input, the mapper 50 generates output onto the line 16 which is input to the channel 18. With this numbering convention, the mapper shown in FIG. 2 will have the left to right order of the input bits as least significant to most significant, i.e., the bit input from the line 70 is most significant and the bit from the line 42 is least significant.

In step 106, the binary tree 80 is truncated at a constant depth to produce a set of signal subconstellations which will correspond to edges. Each signal subconstellation is composed of the signals below the nodes which become leaves in the truncated tree. In step 108, the truncated subconstellations, or edges, are numbered from left to right using binary numbers. With reference to FIG. 2, steps 106 and 108 are implemented in the encoder 14 in the edge selector 52 connected for receiving as input the same binary number as the mapper 50, and for generating the binary number of the subconstellation, or edge, to which the signal point in question belongs, except the most significant bit for the edge number is dropped. Thus it may be observed that the purpose of the edge selector is to generate the binary number of the edge (excepting the most significant bit) to which the signal provided by the mapper belongs. The edge selector 52 was designed by truncating the binary tree 80 shown in FIG. 4 at a depth of four to produce sixteen possible edges. Since the most significant bit (i.e., the bit input from the line 70) is ignored, three bits are output from the edge selector 52. Typically, and as shown in FIG. 2, the steps 106 and 108 can be achieved by "short circuiting" the edge selector 52 so that the bits input from the lines 44, 46, and 48 are output to the lines 58, 56, and 54, respectively, as indicated by the dotted lines in the edge selector of FIG. 2. A tabulation of the mapper output and the edge selector output is provided in FIG. 5. The contribution to the channel output caused by the mapper output is also shown.

Figure 6:
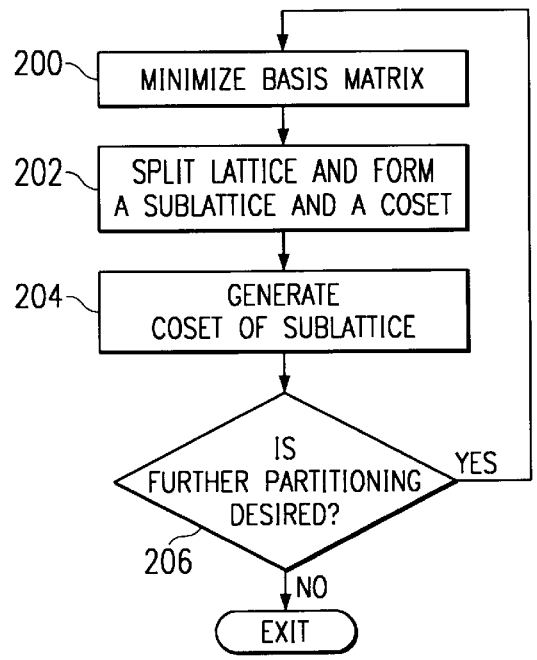
FIG. 6 is a flowchart showing the steps of a lattice partitioning method utilized for constructing a binary tree.

In accordance with the present invention, FIG. 6 is a flow chart showing the steps of a lattice partitioning method that may be utilized for performing the foregoing steps 100 and 102 for constructing the aforementioned binary tree 80. As a preliminary matter, it can be appreciated that the output of an amplitude modulated channel is a subset of a lattice, and any lattice can be represented in terms of the equation $S=\{xH|x \in Z^m\}$, where Z is the set of integers, m is the dimensionality of the lattice, x is a vector of integers, H is a matrix known as a basis, and the m rows of H are basis vectors $b_o \ldots b_{n-1}$, where m=n-1.

In accordance with FIG. 6, in step 200, the basis matrix H is minimized as discussed in D. Krueger, "Trellis Code Design for Intersymbol Interference Channels," Ph.D. dissertation at the University of Oklahoma, Norman, 1995. Once the basis H is minimized, then (1) $b_o$, the first basis vector, will be the smallest nonzero lattice vector; (2) $b_n$, the (n+1)th basis vector, will be the smallest nonzero lattice vector which is linearly independent of the set $\{b_o \ldots, b_{n-1}\}$. Using the minimized basis H, in step 202, the lattice can be split into two parts: a sublattice, and a shifted version of the sublattice known as the coset. This sublattice is found by adding $b_o$ to every vector in the minimized basis, thereby producing a basis for the sublattice. In step 204, the coset of the sublattice is generated by shifting every point in the sublattice by $b_o$. In step 206, a determination is made whether further partitioning is desired. If in step 206, it is determined that further partitioning is desired (i.e., whether the truncation level of the binary tree 80 has been reached), then, because the new basis is not necessarily a minimized basis, in step 208, a new minimized basis is constructed using the technique used in step 200. Once the truncation level of the binary tree has been reached, further partitioning can be done arbitrarily.

As an example, to derive the mapper output shown in FIG. 5, the signal constellation used in the design of the encoder in FIG. 2 is the set $S=\{xH|x\epsilon B^5\}$ where $B=\{0,1\}$, and $$H = \begin{bmatrix} +1 & +1 & -1 & -1 & 0 & 0 & 0 & 0 \\ 0 & +1 & +1 & -1 & -1 & 0 & 0 & 0 \\ 0 & 0 & +1 & +1 & -1 & -1 & 0 & 0 \\ 0 & 0 & 0 & +1 & +1 & -1 & -1 & 0 \\ 0 & 0 & 0 & 0 & +1 & +1 & -1 & -1 \end{bmatrix}$$

To simplify matters, the points in the signal constellation are numbered according to the binary channel input x. These signal constellation points are partitioned according to the specified algorithm to yield the binary tree given in FIG. 4.

Another example is provided showing in greater detail the steps utilized in the design of a trellis code. First, an equalized channel impulse response is determined, and then the code design proceeds in the following manner. Assuming that the channel is a linear, noise-free ISI channel with the input codeword $x_t$, the impulse response $h_j$, $0 \leq j \leq L$, and output y. The channel output to a single codeword can then be written:

$$y_t = x_t H \tag{1}$$

where $$H = \begin{bmatrix} h_0 & h_1 & h_2 & \cdots & h_L & \cdots & \cdots & 0 \\ 0 & h_0 & h_1 & \cdots & h_L & \cdots & \cdots & 0 \\ \vdots & \vdots & \vdots & \ddots & \vdots & \vdots & \ddots & \vdots \\ 0 & 0 & 0 & \cdots & \cdots & h_0 & \cdots & h_L \end{bmatrix} \tag{2}$$

It can be readily verified that the set $S=\{x_tH|x_t\epsilon Z^n\}$ is a lattice under vector addition, since it can be expressed as a linear combination of a finite set of vectors. The lattice partitioning algorithm provided herein can then be applied recursively. The following example assumes codewords of length 3 with quaternary symbols and an equalized channel impulse response $h=[1,-0.3,-0.6]$. The channel output constellation points are expressed in terms of the input codewords.

The basis is next minimized so that it can be partitioned. As discussed above, a basis is minimized if it satisfies the following conditions: (1) $b_0$, the first basis vector, is the smallest nonzero lattice vector, and (2) $b_n$, the (n+1) the basis vector, is the smallest nonzero lattice vector which is linearly independent of the set $\{b_o \ldots b_{n-1}\}$. The minimization may be done using a computerized algorithm implementing the foregoing step 200. In the present example, any new lattice basis will be accompanied by its minimized version as obtained by such an algorithm, the application of which is denoted by the symbol " $\Rightarrow$ ".

Using a minimized basis, a lattice can be split into two parts: a sublattice, and a shifted version of the sublattice known as the coset. This sublattice is found using the minimized basis in the following way: add $b_o$ to every vector in the minimized basis. This produces a basis for the sublattice. The coset of the sublattice can be found by shifting every point in the sublattice by $b_o$. The new basis is not necessarily a minimized basis, so a new minimized basis must be constructed if further partitioning is desired.

The starting point for the partitioning process is a basis for the channel output lattice. For the present example, the starting basis is:

$$\begin{bmatrix} 1.0 & -0.3 & -0.6 & 0 & 0 \\ 0 & 1.0 & -0.3 & -0.6 & 0 \\ 0 & 0 & 1.0 & -0.3 & -0.6 \end{bmatrix} \Rightarrow \begin{bmatrix} 1.0 & -0.3 & -0.6 & 0 & 0 \\ 0 & 1.0 & -0.3 & -0.6 & 0 \\ 0 & 0 & 1.0 & -0.3 & -0.6 \end{bmatrix} \tag{3}$$

The partitioning is performed by adding the first row of the minimized basis to itself and the rest of the rows in the basis. The result of this action appears on the left below. The corresponding minimized basis is shown on the right.

$$\begin{bmatrix} 2.0 & -0.6 & -1.2 & 0 & 0 \\ 1.0 & 0.7 & -0.9 & -0.6 & 0 \\ 1.0 & -0.3 & 0.4 & -0.3 & -0.6 \end{bmatrix} \Rightarrow \begin{bmatrix} 1.0 & -0.3 & 0.4 & -0.3 & -0.6 \\ 1.0 & 0.7 & 0.9 & -0.6 & 0 \\ 0 & -1.0 & -0.7 & -0.9 & 0.6 \end{bmatrix} \tag{4}$$

Repeating the partitioning twice more yields:

$$\begin{bmatrix} 2.0 & -0.6 & 0.8 & 0.6 & 1.2 \\ 2.0 & 0.4 & -0.5 & -0.9 & 0.6 \\ 1.0 & -1.3 & -0.3 & -0.6 & -1.2 \end{bmatrix} \Rightarrow \begin{bmatrix} 0 & 1.0 & -1.3 & -0.3 & 0.6 \\ 1.0 & -1.3 & -0.3 & -0.6 & 0 \\ 1.0 & 0.7 & 1.1 & -1.2 & -1.2 \end{bmatrix} \tag{5}$$

$$\begin{bmatrix} 0 & 2.0 & -2.6 & -0.6 & 1.2 \\ 1.0 & -0.3 & -1.6 & 0.3 & 0.6 \\ 1.0 & 1.7 & -0.2 & -1.5 & -0.6 \end{bmatrix} \Rightarrow \tag{6}$$

$$\begin{bmatrix} 1.0 & -0.3 & -1.6 & 0.3 & 0.6 \\ 1.0 & 1.7 & -0.2 & -1.5 & -0.6 \\ -2.0 & 0.6 & -0.8 & 0.6 & 1.2 \end{bmatrix}$$

One final partitioning is necessary, but in this step the first vector is added to all the rows except the last. Leaving one or more rows out of the partitioning is a design choice determined by trial and error. In this instance, it was determined that leaving the last row out was necessary for an even distribution of signal points in the leaves of the partitioning tree.

$$\begin{bmatrix} 2.0 & -0.6 & -3.2 & 0.6 & 1.2 \\ 2.0 & 1.4 & -1.8 & -1.2 & 0 \\ -2.0 & 0.6 & -0.8 & 0.6 & 1.2 \end{bmatrix} \Rightarrow \begin{bmatrix} -2.0 & 0.6 & -0.8 & 0.6 & 1.2 \\ 2.0 & 1.4 & -1.8 & -1.2 & 0 \\ 0 & -2.0 & -1.4 & 1.8 & 1.2 \end{bmatrix} \tag{7}$$

Examining $b_0$, the smallest nonzero lattice vector at each step of the partitioning process, reveals the following progression of minimum intraset distances:

$$\Delta_0^2=1.45 \quad \Delta_1^2=1.70 \quad \Delta_2^2=3.14 \quad \Delta_3^2=4.10 \quad \Delta_4^2=6.80 \tag{8}$$

These distances will be used below to choose the code trellis.

The row vector which is added to itself and the rest of the basis vectors becomes a coset vector. At each time step, the coset vector is added as a new row to a coset matrix C. Each point in the original lattice then has the following form:

$$y_i = x_i H = uM + vC, \quad (9)$$

where u is an integer vector, M is the minimized basis, v is a coset number vector composed of binary elements, and C is the coset matrix. This equation establishes a mapping between the lattice points y and the coset number vectors v. Equivalently, this equation establishes a mapping between the input vectors x and the coset number vectors v. Each of the lattice points which share the same coset number vector belong to the same coset. The mapping is determined by computer. The mapping is provided below in terms of input vectors x and coset number vectors v.

| v | 0000 | 0001 | 0010 | 0011 | 0100 | 0101 | 0110 | 0111 | 1000 | 1001 | 1010 | 1011 | 1100 | 1101 | 1110 | 1111 |
|---|------|------|------|------|------|------|------|------|------|------|------|------|------|------|------|------|
| x | 000  | 103  | 100  | 001  | 101  | 002  | 003  | 102  | 013  | 112  | 113  | 010  | 110  | 011  | 012  | 111  |
|   | 022  | 121  | 122  | 023  | 123  | 020  | 021  | 120  | 031  | 130  | 131  | 032  | 132  | 033  | 030  | 133  |
|   | 202  | 301  | 302  | 203  | 303  | 200  | 201  | 300  | 211  | 310  | 311  | 212  | 312  | 213  | 210  | 313  |
|   | 220  | 323  | 320  | 221  | 321  | 222  | 223  | 322  | 233  | 332  | 333  | 230  | 330  | 231  | 232  | 331  |

A lookup table, utilized by a mapper, such as the mapper 50, is designed to provide the vector x which corresponds to six input bits, four of which are the coset number vector, and the remaining two of which are used to select one of the four vectors from the coset.

Figure 7:
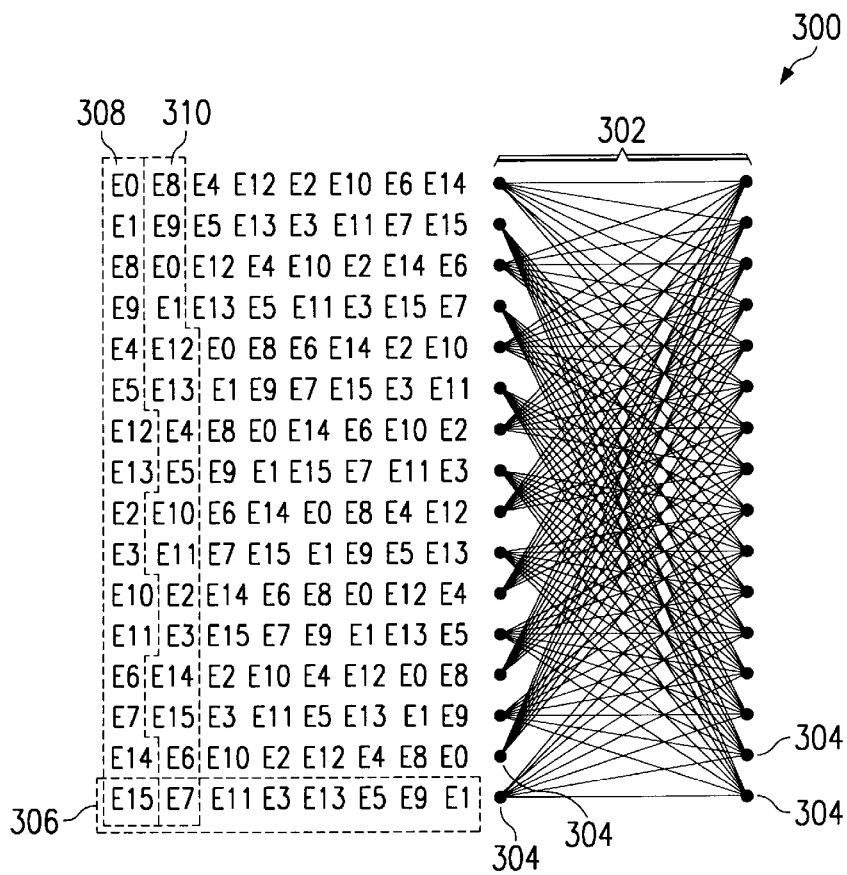
FIG. 7 is a trellis associated with an encoder embodying features of the present invention.

Once the mapper is complete, the remaining step is the selection of an encoder trellis. Two methods for implementing encoder trellises are disclosed. The first is a method described in D. Krueger, "Trellis Code Design for Intersymbol Interference Channels," Ph.D. dissertation at the University of Oklahoma, Norman, 1995, wherein the conventional convolutional encoder method, in which the input bits select the trellis edge, are shifted to become part of the trellis state. An arrangement of XOR gates is used to convert the contents of the encoder shift register (the trellis edge and trellis state) to the binary input to the mapper. In a second method, the input bits provide the binary input to the mapper. The same arrangement of XOR gates is used to select a trellis edge when given the trellis state and a function of the input bits. This method is more versatile than the first, since it allows a non-equal distribution of input vectors to cosets. The chief difficulty in both methods is the determination of the XOR gate arrangement. An optimal arrangement is determined by exhaustive computer search, and the results are tabulated in D. Krueger, "Trellis Code Design for Intersymbol Interference Channels," Ph.D. dissertation at the University of Oklahoma, Norman, 1995. The tabulation specifies the optimal XOR gate arrangement and the code gain it provides, given the number of states and edges in the trellis. Using this tabulation, the chosen trellis is shown in FIG. 7, described below. The expected distance gain of this code is $$(\Delta_1^2 + \Delta_2^2)/\Delta_0^2 = 5.2 dB.$$

Figure 8:
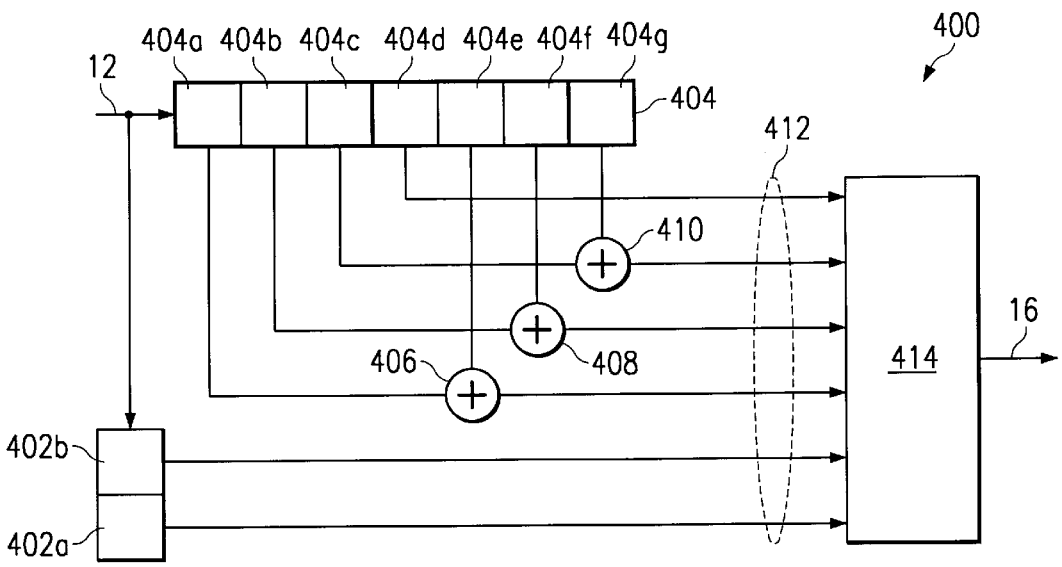
FIGS. 8 and 9 are schematic block diagrams of trellis encoders embodying features of the present invention.
Figure 9:
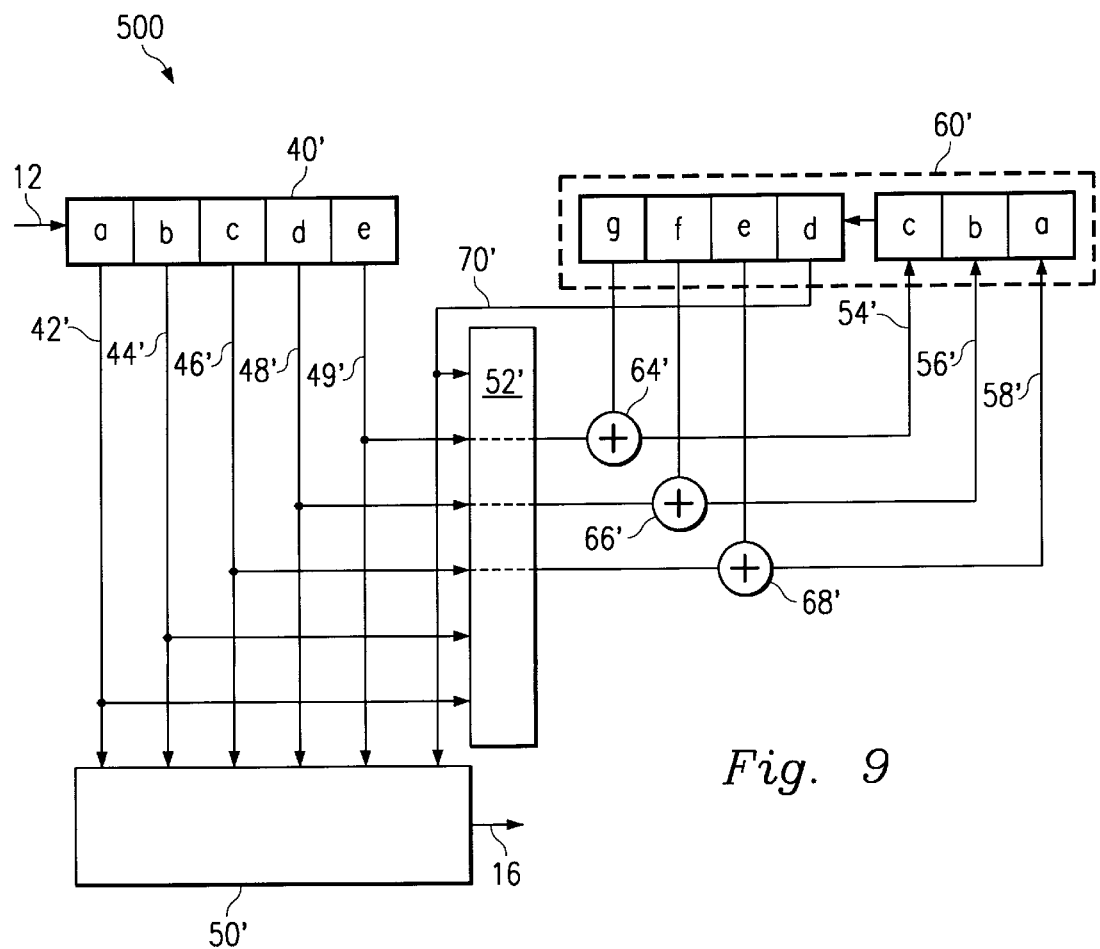

Encoders which may be used to implement this trellis are shown in FIGS. 8 and 9, described below.

With further reference to FIG. 7, it can be appreciated that trellis codes are depicted therein in a manner well known to those skilled in the art. More specifically, the reference numeral 300 generally designates the trellis associated with the foregoing. The trellis 300 includes one stage 302 of the code trellis having nodes, such as the nodes 304. The nodes 304 represent code states, and each node is labeled with a row, such as the row 306, of signals, each of which signals corresponds to a transition. The row 306 is read in blocks, such as the blocks 308 and 310, the number of which blocks is equal to the number of edges exiting from the corresponding node. For example, the leftmost block 308 corresponds to the topmost edge, and the next leftmost edge 310 corresponds to the second topmost edge. If each block has more than one signal, then these signals correspond to parallel transitions between the states connected by the appropriate edges.

With further reference to FIGS. 8 and 9, the reference numerals 400 and 500, respectively, generally designate encoders for implementing the foregoing trellis. The encoders 400 and 500, as shown, are connected to the same input and output lines 12 and 16, respectively, as the encoder shown in FIG. 2.

The encoder 400 shown in FIG. 8 includes a two cell register 402 and a shift register 404. The register 402 includes cells 402a and 402b, and the shift register 404 includes cells 404a, 404b, 404c, 404d, 404e, 404f, and 404g. The cells 402a, 402b, 404a, 404b, and 404c perform substantially the same function as that performed by the cells 40a, 40b, 40c, and 40d shown in FIG. 2, and the shift register 404 performs substantially the same function as that performed by the shift register 60. The encoder 400 also includes three modulo-2 adders 406, 408, and 410 which perform substantially the same function as that performed by the adders 62, 64, 66, and 68. The output from the registers 402 and 404 and the adders 406, 408, and 410 is input via lines 412 to a mapper 414 which perform substantially the same function as that performed by the mapper 50 for generating an output signal onto the line 16. The encoder 400 is similar to the encoder 14, except for the absence of a feedback loop, and, therefore, will not be described in further detail.

The encoder 500 shown in FIG. 9 is a feedback encoder similar to the feedback encoder 14 shown in FIG. 2, except for the number of bits processed and the number of lines and cells utilized to accommodate the additional bits. Accordingly, similar components are labeled with the same or similar numbers as used in FIG. 2, though with primes appended thereto to distinguish them. The operation of the encoder 500 is similar to that of the encoder 14 and, therefore, will not be described in further detail.

In operation, the trellis encoded digital communications system 10 is operable for receiving four bits of data at a each clock cycle from the line 12 into the four register cells 40a, 40b, 40c, and 40d. In the first clock cycle following each clock cycle, the data bits are then transferred from the cells 40a, 40b, 40c, and 40d to the mapper 50, through the edge selector 52, the modulo-2 adders 62–68, and to the shift register 60, cells 60a–60c. In the second clock cycle following each clock cycle, the contents of the shift register 60 shift three cells to the left, as viewed in FIG. 2, and the value (i.e., the redundancy bit) stored in the cell 60d is passed to the mapper 50 and the edge selector 52. It can be appreciated that the redundancy bit passed to the mapper 50 and to the edge selector 52 is generated from the bits passed on the lines 42, 44, 46, and 48 in the immediately preceding clock cycle, thereby providing a time dependent element in the code. In response to the bits input to the mapper 50, five bits of coded data are output via the line 16 to the equivalent discrete channel 18. Upon receipt of the encoded data by the channel 18, the digital modulator 26 modulates the data for the channel 30, the channel 30 carries the data, and the demodulator 34 demodulates the data. The demodulated data is output to the channel decoder 22, which then decodes the data using a conventional algorithm such as the Viterbi algorithm, and outputs the data onto the line 24, which output data corresponds to the data input to the line 12.

The present invention has several advantages. For example, the codes circumvent the necessity for intersymbol interference removal, thereby reducing equalization complexity. Data can be encoded with a lower error rate than is possible with the prior art. Conversely, for a given error rate, given an allowable error rate, the complexity, and hence the cost, of an encoding system is lower than is possible with the prior art.

It is understood that several variations may be made in the foregoing without departing from the scope of the invention. For example, variations on the foregoing partitioning technique exist. More specifically, it may not be necessary to add $b_o$ to every vector in the minimized basis to increase the minimum distance between sublattice points. Failing to add $b_o$ to a given basis vector has the effect of carrying that basis vector over into the new basis. This will not be a problem if the vector in question is significantly larger than $b_o$, and it may result in the sublattice and coset having a more favorable division in some respect. In another example, the modulo-2 adders 62–68 may be supplemented and/or rearranged, and an additional modulo-2 adder may be interconnected between the line 70 for summing the contents of the cell 60d with the contents of another cell of the encoder state register 60. The encoder 10 may also be readily adapted to encode a lesser or greater number of bits input onto the line 12, other than the number of bits described in the foregoing.

Although illustrative embodiments of the invention have been shown and described, a wide range of modification, change, and substitution is contemplated in the foregoing disclosure and in some instances, some features of the present invention may be employed without a corresponding use of the other features. Accordingly, it is appropriate that the appended claims be construed broadly and in a manner consistent with the scope of the invention.

What is claimed is:

1. A method for designing a logic circuit which implements a mapping from a set of input words to a set of output words, wherein the mapping is determined by constructing a binary tree, and wherein the set of output words is split into at least one coset having leaves of the binary tree, the method of determining the at least one coset comprising the steps of:

forming a minimized basis composed of a set of minimized basis vectors for a set of channel output signals corresponding to the set of output words;

selecting the smallest member of the set of minimized basis vectors as a coset vector;

forming a partition basis by adding the coset vector to at least one member of the set of minimized basis vectors; and forming a subsequent minimized basis from the partition basis.

2. A method for designing a logic circuit which implements a mapping from a set of input vectors to a set of output vectors, wherein the mapping is determined by constructing a binary tree, and wherein the set of output vectors is split into at least one coset having leaves of the binary tree, the method of determining the at least one coset comprising the steps of:

(a) forming a minimized basis composed of a set of minimized basis vectors for a set of channel output signals corresponding to the set of output vectors;

(b) selecting the smallest member of the set of minimized basis vectors as a coset vector;

(c) noting the coset vector in a list of coset vectors;

(e) forming a partition basis by adding the coset vector to at least one member of the set of minimized basis vectors;

(f) forming a subsequent minimized basis from the partition basis; and (e) repeating steps (b), (c), (d), and (e) as necessary to achieve a desired minimum distance between a coset of channel output signals corresponding to one of the at least one cosets of output vectors, the membership of the one of the at least one cosets of output vectors being determined by a mutual shared combination of at most one of each vector in the list of coset vectors, the combination being that used to express the coset of channel output signals corresponding to one of the at least one coset of output vectors in terms of a final minimized basis and the list of coset vectors.

3. The method of claim 2 wherein the minimum distance is the minimum Euclidean distance.

4. The method of claim 2 wherein the set of channel output signals corresponding to the set of output vectors can be determined by a correspondence expressing an output signal from an interference-free discrete-time channel in terms of an input signal which is assumed to be zero for all time outside a time interval during which a member of the set of output vectors determines the input signal.

5. The method of claim 2 further comprising the step of extending the binary tree by arbitrarily splitting the at least one coset until each of the at least one cosets has only one member.

6. The method of claim 2 wherein the mapping excludes one or more of the at least one cosets.

7. The method of claim 2, further comprising the steps of fabricating the logic circuit and mounting the fabricated logic circuit into an encoder module configured for receiving a sequence of user data vectors and, in response to the received sequence of user data vectors, generating a sequence of output vectors.

8. The method of claim 7, further comprising the step of providing a convolutional encoder having:

a shift register for storing a predetermined number of user data vectors; and a plurality of logic gates interconnected between the shift register and the logic circuit, the plurality of logic gates being configured for generating, from the contents of the shift register and a current user data vector, an input vector to the logic circuit.

9. The method of claim 7, further comprising the steps of:

connecting, between an input register and the logic circuit, a shift register configured for storing at least one edge vector;

connecting to the shift register a plurality of logic gates configured for determining a current edge vector based on a current user vector and the contents of the shift register; and connecting to the logic circuit an additional circuit which forms an input vector to the logic circuit from the current user vector and the contents of the shift register.

10. The method of claim 7, further comprising the step of integrating the logic circuit into a digital communications system having:

an encoder portion into which the encoder module is integrated, the encoder portion being configured for receiving an input sequence of user data and, in response to the received data, for generating an encoded sequence of data;

a discrete-time channel coupled to the encoder portion for receiving the encoded sequence of data and for generating from the input sequence an output sequence of data; and a decoder coupled to the channel for receiving and decoding the output sequence of data, and for outputting the decoded sequence of data.

11. A method for mapping a set of input vectors to a set of output vectors, the method comprising:

forming a minimized basis having a set of minimized basis vectors configured for a set of channel output signals corresponding to the set of output vectors;

selecting the smallest member of the set of minimized basis vectors as a coset vector;

forming a partition basis by adding the coset vector to at least one member of the set of the minimized basis vectors; and forming a subsequent minimized basis from the partition basis.

12. The method of claim 11 further comprising, after the step of selecting, the step of noting the coset vector in a list of coset vectors; and, after the step of forming a subsequent basis, repeating the steps of selecting, noting, forming a partition basis, forming a subsequent basis as necessary to achieve a desired minimum Euclidean distance between a coset of channel output signals corresponding to one of the at least one cosets of output vectors, the membership of the one of the at least one cosets of output vectors being determined by a mutual shared combination of at most one of each vector in the list of coset vectors, the combination being that used to express the coset of channel output signals corresponding to one of the at least one coset of output vectors in terms of a final minimized basis and the list of coset vectors.

13. The method of claim 12 wherein the set of channel output signals corresponding to the set of output vectors can be determined by a correspondence expressing an output signal from an interference-free discrete-time channel in terms of an input signal which is assumed to be zero for all time outside a time interval during which a member of the set of output vectors determines the input signal.

14. The method of claim 12 further comprising the step of extending the binary tree by arbitrarily splitting the at least one coset until each of the at least one cosets has only one member.

15. The method of claim 12 wherein the mapping excludes one or more of the at least one cosets.

16. The method of claim 12, further comprising the steps of fabricating the logic circuit and mounting the fabricated logic circuit into an encoder module configured for receiving a sequence of user data vectors and, in response to the received sequence of user data vectors, generating a sequence of output vectors.

17. The method of claim 15, further comprising the steps of:

connecting, between an input register and the logic circuit, a shift register configured for storing at least one edge vector;

connecting to the shift register a plurality of logic gates configured for determining a current edge vector based on a current user vector and the contents of the shift register; and connecting to the logic circuit an additional circuit which forms an input vector to the logic circuit from the current user vector and the contents of the shift register.

18. The method of claim 15, further comprising the step of integrating the logic circuit into a digital communications system having:

an encoder portion into which the encoder module is integrated, the encoder portion being configured for receiving an input sequence of user data and, in response to the received data, for generating an encoded sequence of data;

a discrete-time channel coupled to the encoder portion for receiving the encoded sequence of data and for generating from the input sequence an output sequence of data; and a decoder coupled to the channel for receiving and decoding the output sequence of data, and for outputting the decoded sequence of data.

\* \* \* \* \*

UNITED STATES PATENT AND TRADEMARK OFFICE
CERTIFICATE OF CORRECTION

PATENT NO. : 5,982,818
DATED : November 9, 1999
INVENTOR(S) : Daniel J. Krueger and Joao R. Cruz It is certified that error appears in the above-indentified patent and that said Letters Patent is hereby corrected as shown below:

Column 1, line 34, "Calderbank" should be -- Eyuboğlu --.

Column 6, equation 4, right matrix, line 27, "0.9" should be -- -0.9 --.

Column 6, equation 4, right matrix, line 28, "-0.9" should be -- 0.9 --.

Column 6, equation 5, left matrix, line 33, "0.6" should be -- -0.6 --.

Column 6, equation 5, left matrix, line 33, "1.2" should be -- -1.2 --.

Column 6, equation 5, left matrix, line 34, "0.6" should be -- -0.6 --.

Column 6, equation 5, right matrix, line 34, "-0.6" should be -- 0.6 --.

Column 6, equation 5, left matrix, line 35, "-0.6" should be -- 0.6 --.

Column 6, equation 5, left matrix, line 35, "-1.2" should be -- 0 --.

Column 12, line 13, "fabricating the" should be -- fabricating a --.

Signed and Sealed this

Sixth Day of March, 2001

Attest:

NICHOLAS P. GODICI

*Attesting Officer*      *Acting Director of the United States Patent and Trademark Office*